(12) United States Patent
Franklin

(10) Patent No.: US 8,732,940 B2
(45) Date of Patent: May 27, 2014

(54) SYSTEM AND METHOD FOR MOUNTING PHOTOVOLTAIC PANELS

(75) Inventor: Scott Franklin, Nederland, CO (US)

(73) Assignee: Clean Energy Solutions, Inc., Boulder, CO (US)

( * ) Notice: Subject to any disclaimer, the term of this patent is extended or adjusted under 35 U.S.C. 154(b) by 708 days.

(21) Appl. No.: 12/723,476

(22) Filed: Mar. 12, 2010

(65) Prior Publication Data

US 2010/0229367 A1    Sep. 16, 2010

Related U.S. Application Data

(60) Provisional application No. 61/159,677, filed on Mar. 12, 2009, provisional application No. 61/254,974, filed on Oct. 26, 2009.

(51) Int. Cl.
| | | |
|---|---|---|
| E04D 13/18 | (2014.01) | |
| F24J 2/52 | (2006.01) | |
| H01L 31/042 | (2014.01) | |

(52) U.S. Cl.
CPC .............. *F24J 2/5258* (2013.01); *Y02E 10/47* (2013.01); *Y02B 10/12* (2013.01); *H01L 31/0422* (2013.01); *F24J 2/5205* (2013.01); *Y02E 10/50* (2013.01)
USPC ....... 29/729; 29/464; 29/890.033; 29/525.01; 52/173.3; 136/244

(58) Field of Classification Search
USPC ............... 29/464, 890.033, 428, 469, 525.01, 29/729; 136/244; 52/173.3
See application file for complete search history.

(56) References Cited

U.S. PATENT DOCUMENTS

| | | | |
|---|---|---|---|
| 4,097,308 A | * | 6/1978 | Klein et al. .................... 136/251 |
| 4,537,838 A | | 8/1985 | Jetter et al. |
| 4,677,248 A | | 6/1987 | Lacey |
| 4,999,060 A | * | 3/1991 | Szekely et al. ................ 136/251 |
| 5,252,141 A | * | 10/1993 | Inoue et al. .................... 136/251 |
| 5,290,366 A | | 3/1994 | Riermeier et al. |
| 5,338,369 A | | 8/1994 | Rawlings |
| 5,409,549 A | | 4/1995 | Mori |
| 5,566,926 A | * | 10/1996 | Voigt ........................... 256/13.1 |
| 5,589,006 A | | 12/1996 | Itoyama et al. |
| 5,706,617 A | | 1/1998 | Hirai et al. |
| 5,768,831 A | | 6/1998 | Melchior |

(Continued)

OTHER PUBLICATIONS www.multi-contact.com, "Multi-Contact" Staubli Group, Solarline, 8 pages (2006).

*Primary Examiner* — Peter DungBa Vo
*Assistant Examiner* — Kaying Kue
(74) *Attorney, Agent, or Firm* — Hoffmann & Baron, LLP

(57) ABSTRACT

A system for securing photovoltaic panel modules to a support structure includes a first elongate member securable to the support structure. The first elongate member includes a plurality of first mounting sites positionally fixed thereon. A second elongate member is securable to the support structure. The second elongate member includes a plurality of second mounting sites positionally fixed thereon. The second elongate member is spaced from the first elongate member and aligned therewith in a generally parallel orientation. The position of the first and second elongate members is adjustable to align the first and second fixed mounting sites in a predetermined configuration. When the first and second elongate members are aligned in the predetermined configuration, the plurality of first mounting sites and second mounting sites are brought into alignment with each other to permit mounting of a plurality of panel modules to the first and second elongate members.

6 Claims, 17 Drawing Sheets

(56) References Cited

U.S. PATENT DOCUMENTS

| | | | |
|---|---|---|---|
| 6,065,255 A * | 5/2000 | Stern et al. | 52/173.3 |
| 6,111,189 A | 8/2000 | Garvison et al. | |
| 6,138,420 A * | 10/2000 | Fyfe | 52/262 |
| 6,269,596 B1 | 8/2001 | Ohtsuka et al. | |
| 6,465,724 B1 * | 10/2002 | Garvison et al. | 136/244 |
| 6,649,822 B2 | 11/2003 | Eguchi et al. | |
| 6,672,018 B2 * | 1/2004 | Shingleton | 52/173.3 |
| 6,730,841 B2 | 5/2004 | Heckeroth | |
| D496,248 S | 9/2004 | Liebendorfer | |
| D496,249 S | 9/2004 | Liebendorfer | |
| 6,875,914 B2 | 4/2005 | Guha et al. | |
| 6,982,019 B2 * | 1/2006 | Rey-Mermet et al. | 156/145 |
| 7,012,188 B2 * | 3/2006 | Erling | 136/251 |
| 7,260,918 B2 * | 8/2007 | Liebendorfer | 52/173.3 |
| 7,317,405 B2 * | 1/2008 | Green et al. | 340/907 |
| 7,434,362 B2 | 10/2008 | Liebendorfer | |
| 7,766,292 B2 * | 8/2010 | Liebendorfer | 248/237 |
| 7,806,377 B2 * | 10/2010 | Strizki | 248/200 |
| 8,006,452 B2 * | 8/2011 | Ceria | 52/506.05 |
| 8,109,048 B2 * | 2/2012 | West et al. | 52/173.3 |
| 8,128,044 B2 * | 3/2012 | Liebendorfer | 248/237 |
| 2003/0015636 A1 | 1/2003 | Liebendorfer | |
| 2003/0184257 A1 | 10/2003 | Nomura et al. | |
| 2004/0084078 A1 | 5/2004 | Yoshida et al. | |
| 2004/0187909 A1 | 9/2004 | Sato et al. | |
| 2007/0079865 A1 | 4/2007 | Warfield et al. | |
| 2009/0064606 A1 * | 3/2009 | Ceria | 52/173.3 |
| 2010/0065107 A1 * | 3/2010 | Nightingale et al. | 136/251 |
| 2010/0078058 A1 * | 4/2010 | Nightingale et al. | 136/244 |
| 2010/0089389 A1 * | 4/2010 | Seery et al. | 126/608 |
| 2010/0139742 A1 * | 6/2010 | Wayman et al. | 136/251 |
| 2010/0193012 A1 * | 8/2010 | Klammer et al. | 136/251 |
| 2010/0294343 A1 * | 11/2010 | Wexler et al. | 136/251 |
| 2011/0203637 A1 * | 8/2011 | Patton et al. | 136/244 |
| 2011/0308177 A1 | 12/2011 | Hickman | |
| 2011/0308566 A1 * | 12/2011 | Johnson | 136/244 |

* cited by examiner

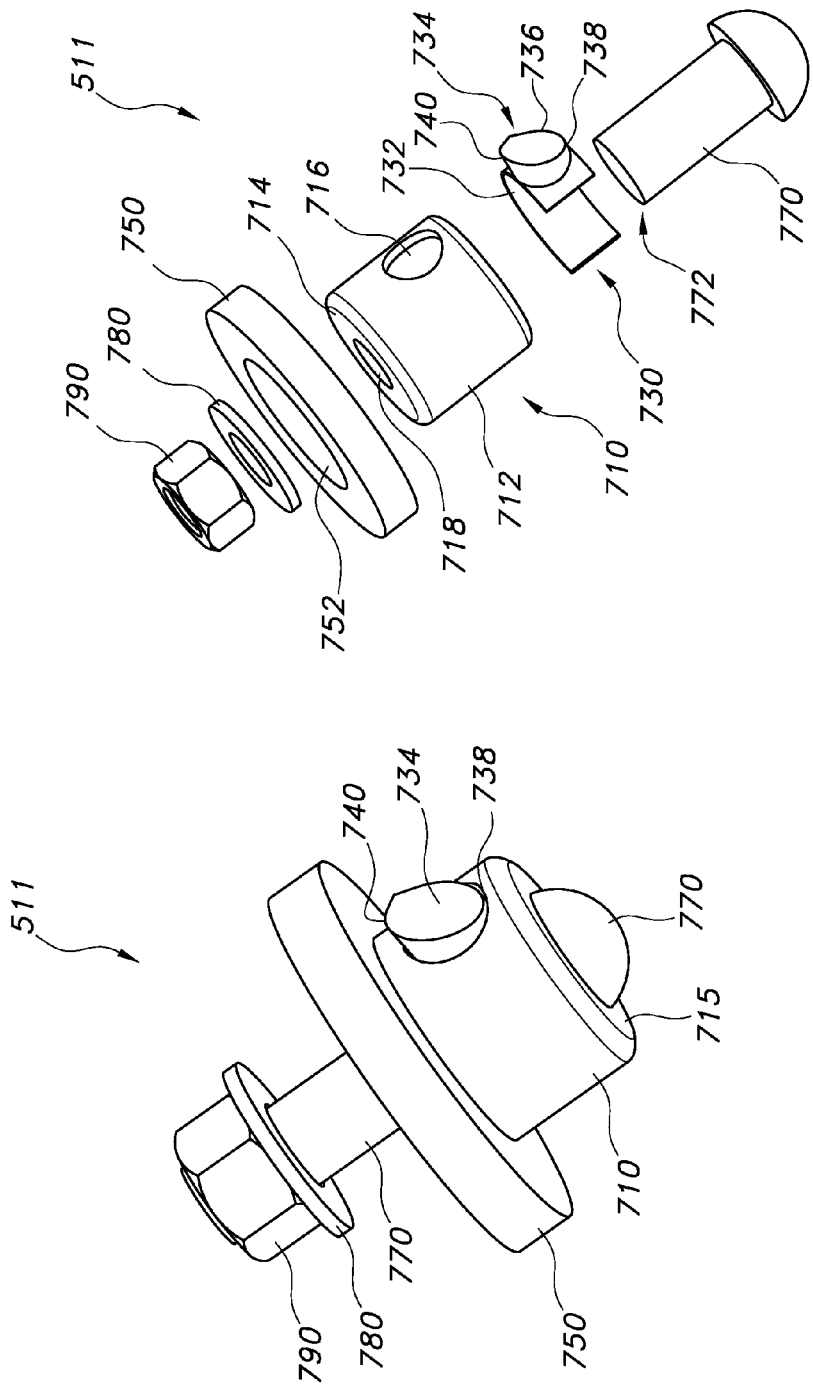

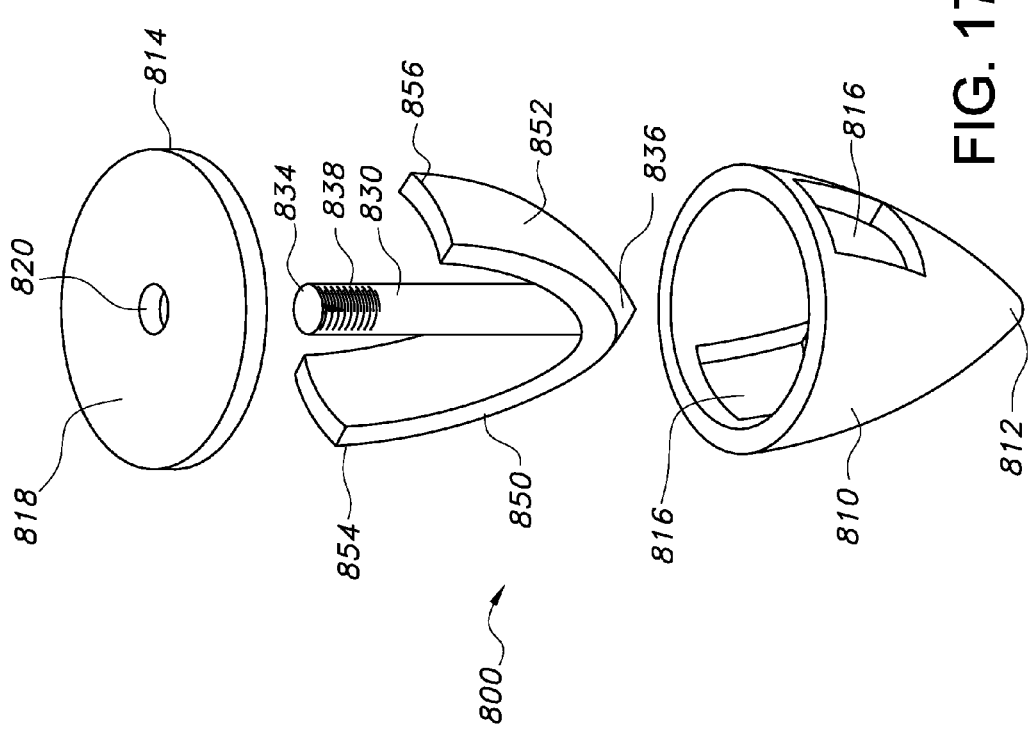
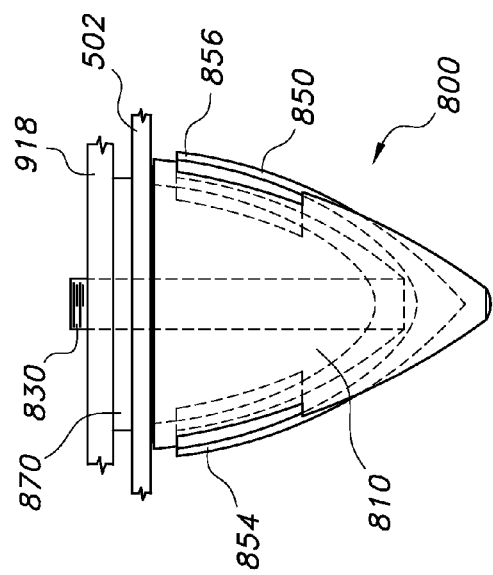
FIG. 17
FIG. 16

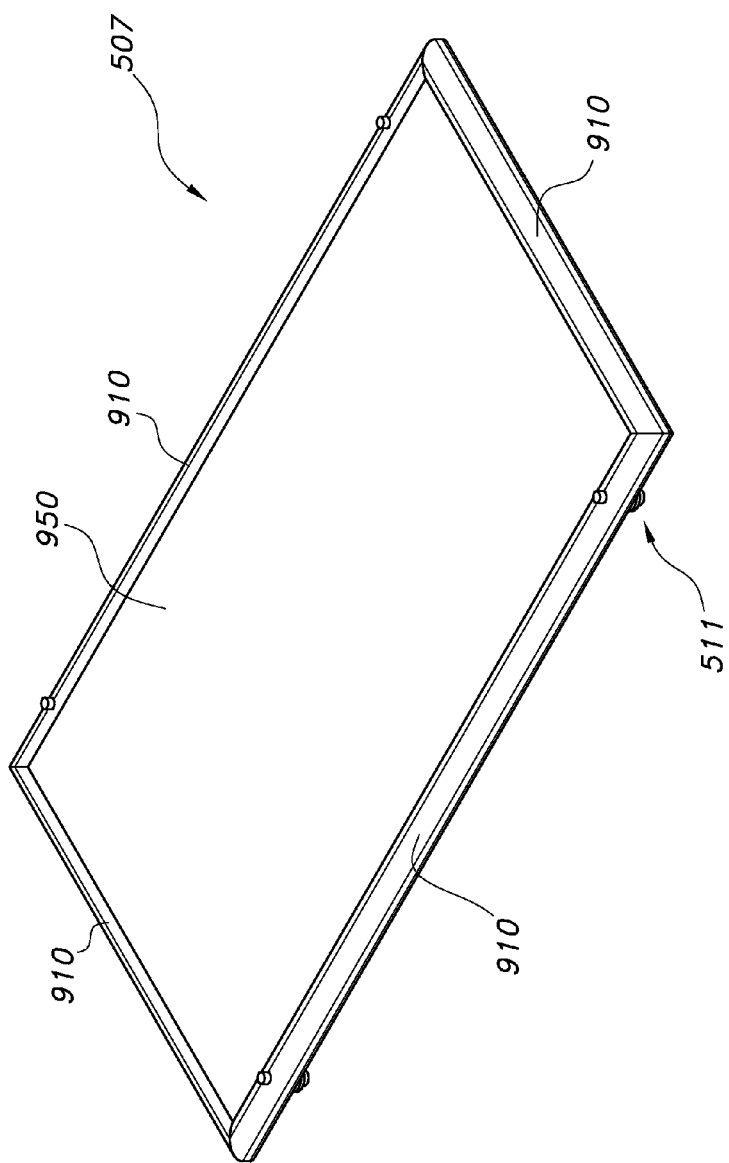

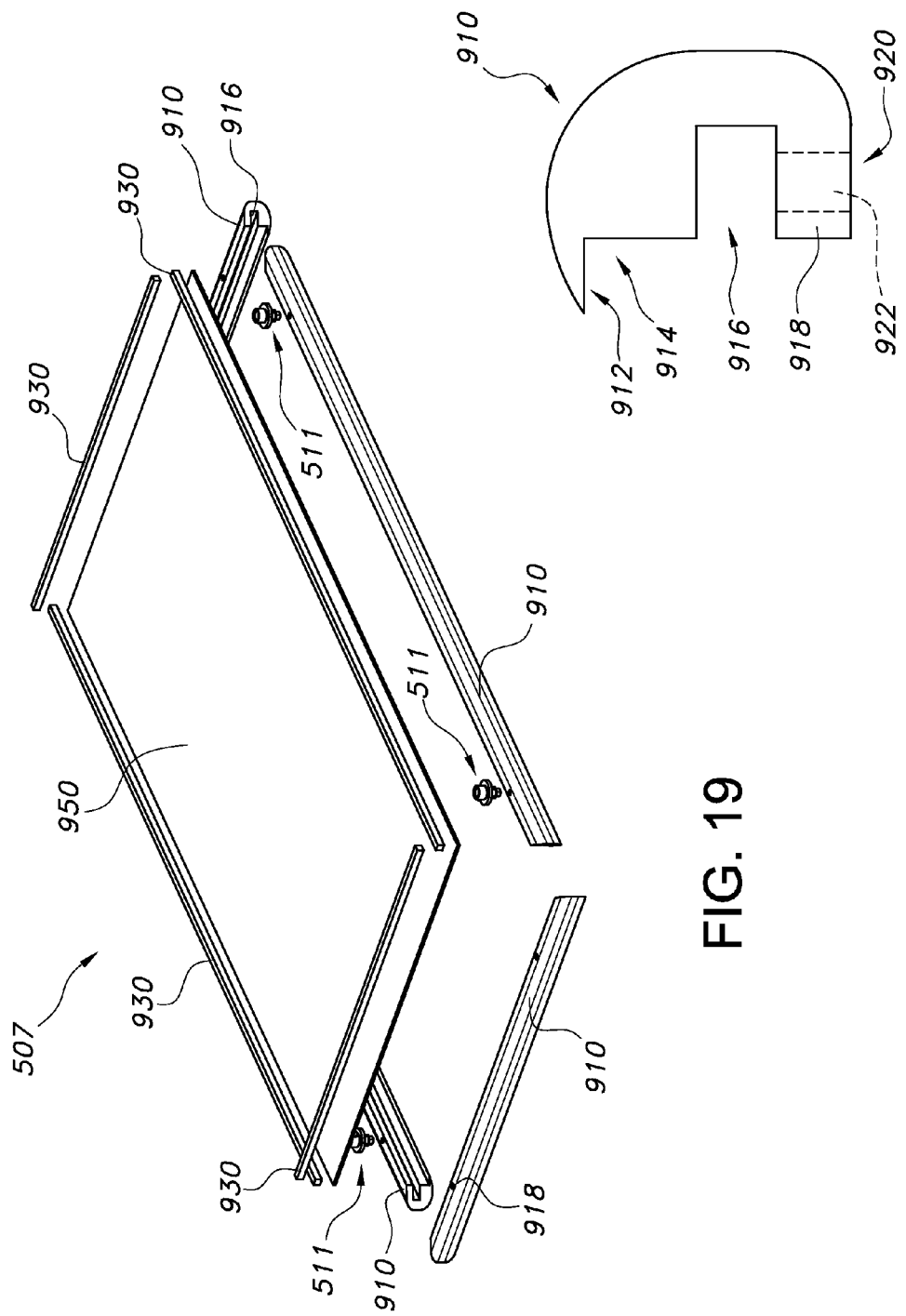

SYSTEM AND METHOD FOR MOUNTING PHOTOVOLTAIC PANELS

The present application claims the benefit of priority to U.S. Provisional Application Nos. 61/159,677 filed Mar. 12, 2009 and 61/254,974 filed Oct. 26, 2009, and both applications are hereby incorporated by reference herein in their entirety for all purposes.

FIELD OF INVENTION

The present invention relates to a system and method for securing panels and more particularly to a system and method for photovoltaic panels to a structure.

BACKGROUND OF THE INVENTION

Photovoltaic ("PV") panels, also known as solar panels, are well known in the art for converting solar energy into electrical energy. As the desirability for clean and efficient energy sources increases, so does the desire to use power sources such as PV panels.

PV panels are typically mounted on a structure, such as a roof of a house or building where they are readily exposed to sunlight. Since the panels are exposed to the environment, they need to be properly secured to the structure so they can withstand winds and other environmental effects. Photovoltaic panels are typically secured to structures by way of elongated rails secured to the structure. It is known to use various clamps and hardware which are securable by a threaded bolt and nut to an elongated rail. The clamps may be positioned to engage and secure the PV panels.

Accordingly, the PV mounting systems of the prior art require the securement and adjustment of numerous fastening elements to secure the PV panels. In addition, adjustments as to the position of each panel are often required which is time consuming and increases the complexity and cost of installation.

When the PV panels are installed, each panel can be wired together and the wiring is typically terminated in a junction box. In the junction box, the PV panel wiring can be connected to the main power line of the site. PV panels are typically located on the roof of structures, therefore, the panel wiring is often subject to extreme weathering conditions and abrasion by animals can degrade and damage the wiring's insulation. Damage to the wiring requires costly service repairs and keeps the affected panels offline until such repairs are made. In order to protect the wiring, it may be run through conventional wire conduit. However, this requires additional components and complicates the installation process.

Accordingly, it would be desirable to provide a system and method for securing PV panels to a structure in a secure and efficient manner.

SUMMARY

According to aspects described herein, there is disclosed a system for securing photovoltaic panel modules to a support structure includes a first elongate member securable to the support structure. The first elongate member includes a plurality of first mounting sites positionally fixed thereon. A second elongate member is securable to the support structure. The second elongate member includes a plurality of second mounting sites positionally fixed thereon. The second elongate member is spaced from the first elongate member and aligned therewith in a generally parallel orientation. The position of the first and second elongate members is adjustable to align the first and second fixed mounting sites in a predetermined configuration. When the first and second elongate members are aligned in the predetermined configuration, the plurality of first mounting sites and second mounting sites are brought into alignment with each other to permit mounting of a plurality of panel modules to the first and second elongate members.

According to further aspects described herein, there is disclosed a system for mounting photovoltaic (PV) panel modules to a support structure including a first PV panel module including mounting structures thereon. A first elongate member is securable to the support structure and includes a plurality of first mounting sites positionally fixed thereon and spaced along a length of the first elongate member. A second elongate member is securable to the support structure and includes a plurality of second mounting sites positionally fixed thereon and spaced along a length of the second elongate member. The second elongate member is spaced from the first elongate member and aligned therewith in a generally parallel orientation. The position of the first and second elongate members is adjustable relative to each other to align the first and second mounting sites in a configuration to form a first set of fixed mounting sites corresponding to the mounting structures on the first PV panel, wherein the first PV panel module is securable to the first and second elongate members upon cooperation of the first set of mounting sites and the mounting structures.

According to still further aspects described herein, there is disclosed a method of securing photovoltaic (PV) panel modules to a structure including:

adjustably securing a first elongate member having a plurality of positionally fixed first mounting sites to the support structure;

securing a second elongate member having a plurality of positionally fixed second mounting sites to the support structure spaced from the first elongate member, wherein the first and second elongate members are in a generally parallel orientation;

adjusting a position of the first elongate member relative to the second elongate member to place the first and second elongate members in a predetermined alignment, wherein when the first and second elongate members are brought into the predetermined alignment, the first and second plurality of mounting sites are brought into alignment to accommodate the mounting of a plurality of PV panel modules;

fixing the position of the first elongate member to maintain the predetermined alignment;

positioning a first PV panel module having a plurality of positionally fixed mounting structures over the first and second elongate members; and securing the first PV panel module to the first and second elongate members.

BRIEF DESCRIPTION OF THE DRAWINGS

FIG. 14 depicts a perspective view of an attachment device of a PV mounting system;

FIG. 15 depicts an exploded view of the attachment device of FIG. 14;

FIG. 16 depicts a side view of an alternative embodiment of an attachment device;

FIG. 17 depicts an exploded view of the alternative embodiment of the attachment device of FIG. 16;

FIG. 18 depicts a perspective view of a PV panel in a frame;

FIG. 19 depicts an exploded perspective view of a PV panel module of FIG. 18;

FIG. 20 depicts a cross sectional view of a frame member of the PV panel module of FIG. 18.

DETAILED DESCRIPTION

Exemplary embodiments are directed to a mounting system for mounting panels, such as photovoltaic (PV) panels, to a structure, such as a roof on a building. The mounting system allows for one or more, such as an array, of panels to be mounted in various configurations.

Figure 1:
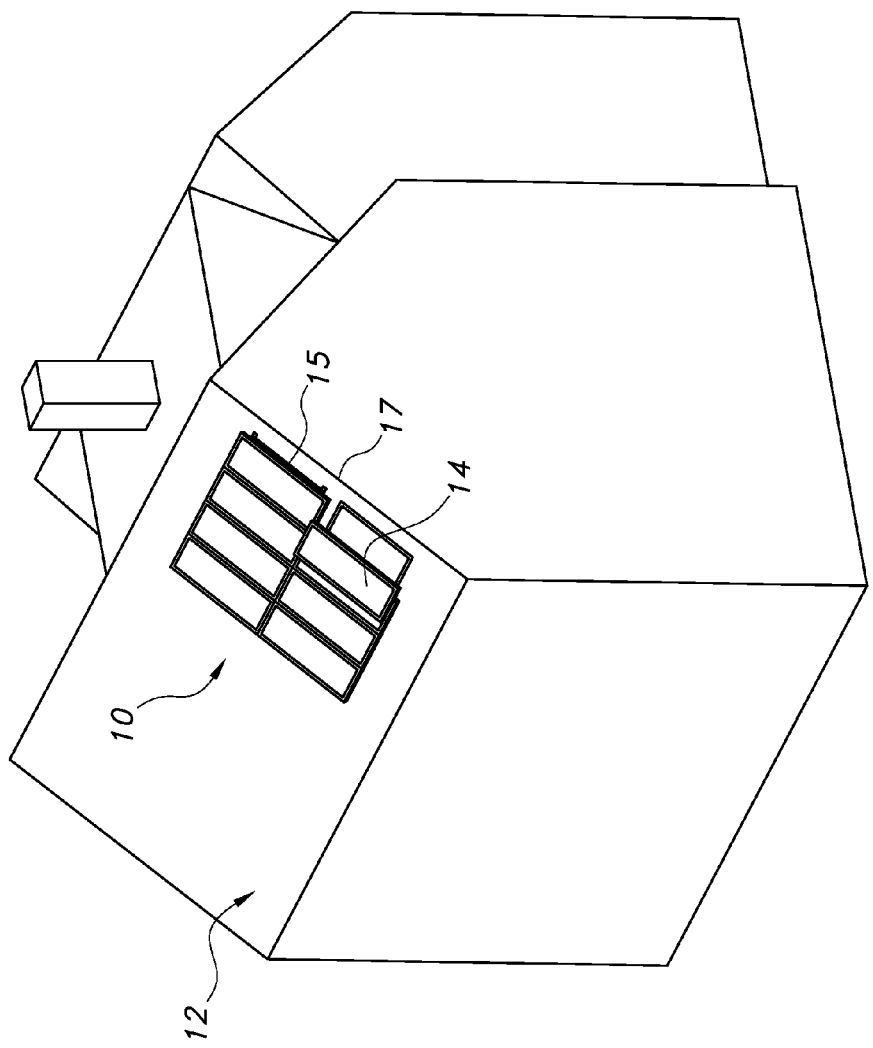
FIG. 1 depicts the photovoltaic (PV) mounting system secured to a structure in accordance with an embodiment of the present invention.
Figure 2:
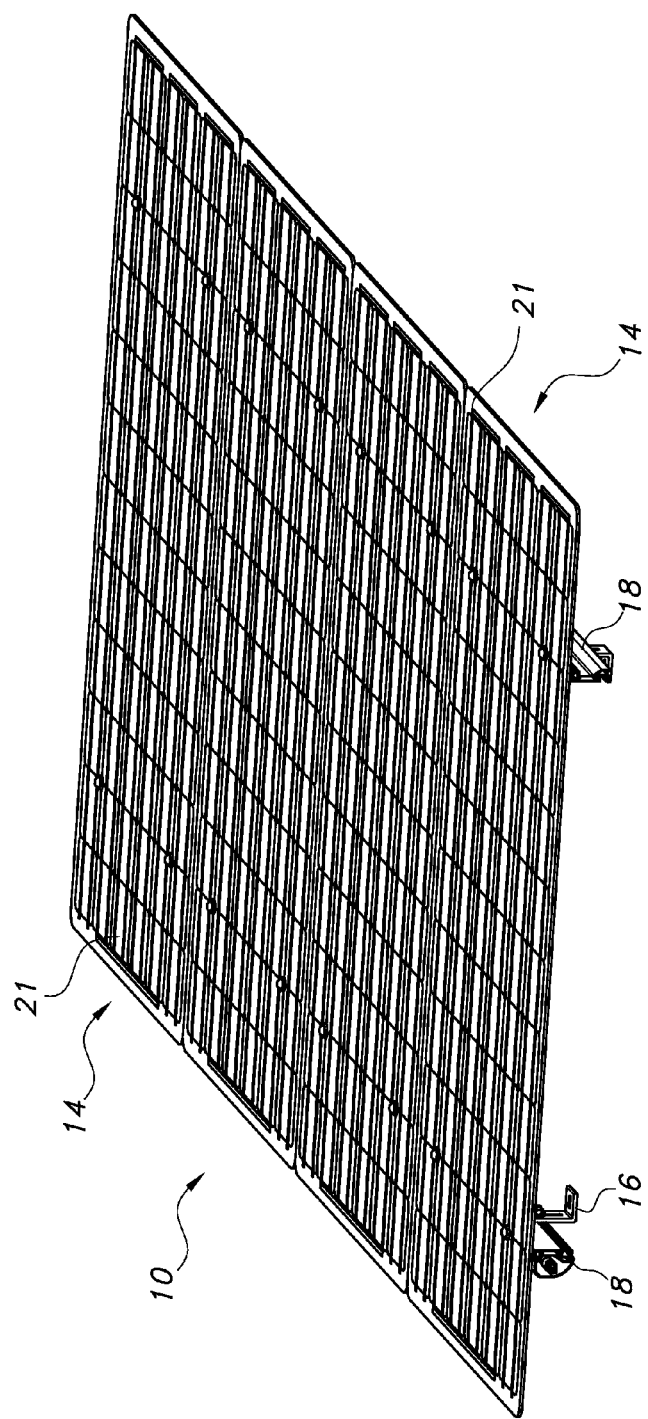
FIG. 2 depicts a perspective view of the PV mounting system of FIG. 1.

With reference to FIGS. 1-2, the mounting system 10 may be mounted to a structure 12, such as a roof of a commercial or residential building. The mounting system includes panel modules 14 each including PV panel 21 for generating electricity. A plurality of panel modules may be mounted side by side forming a row 15. One or more rows of panel modules 14 may be mounted forming a panel array 17. The array 17 may be electrically connected to the electrical service of the building.

Figure 3:
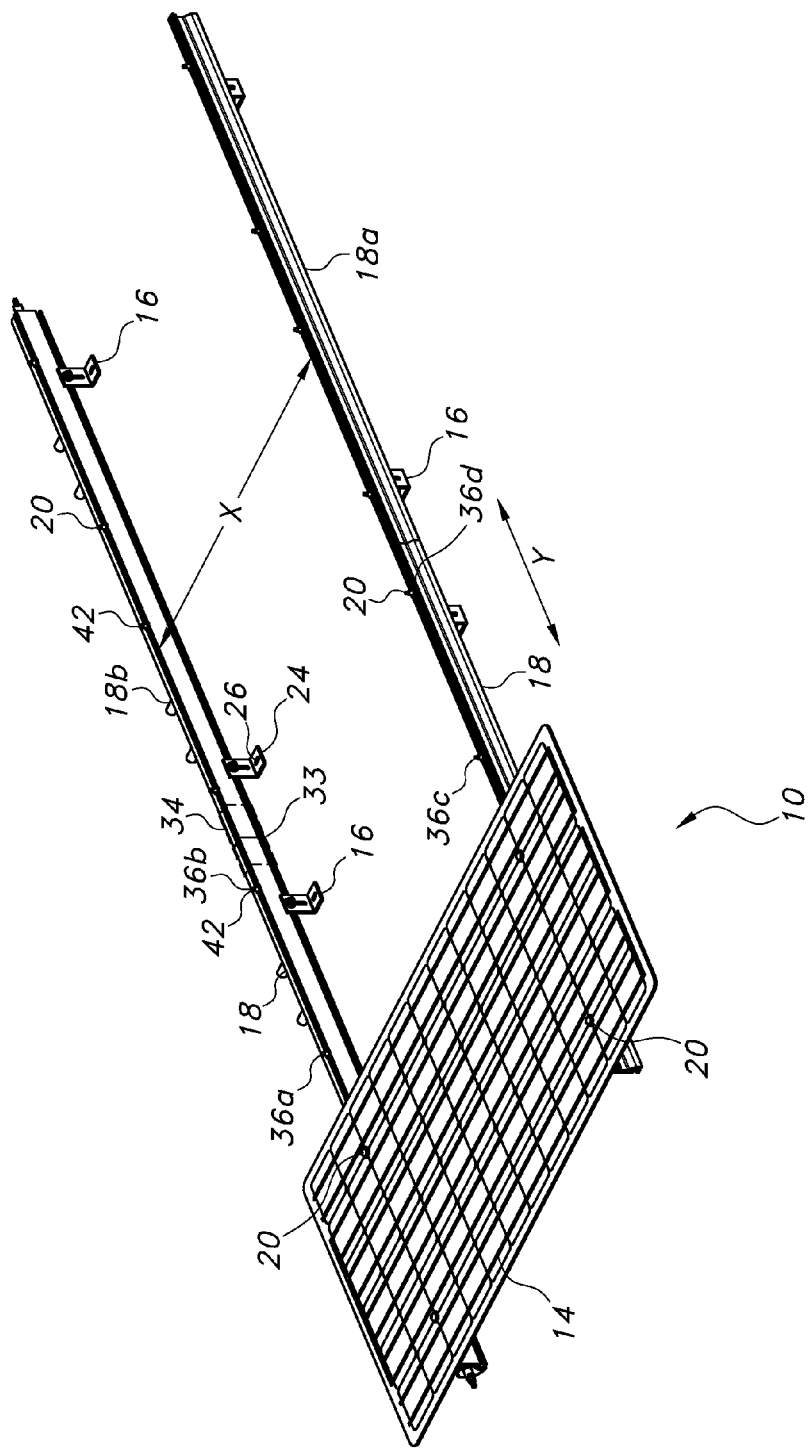
FIG. 3 depicts a perspective view of elongate mounting members and a panel module secured thereto.
Figure 4:
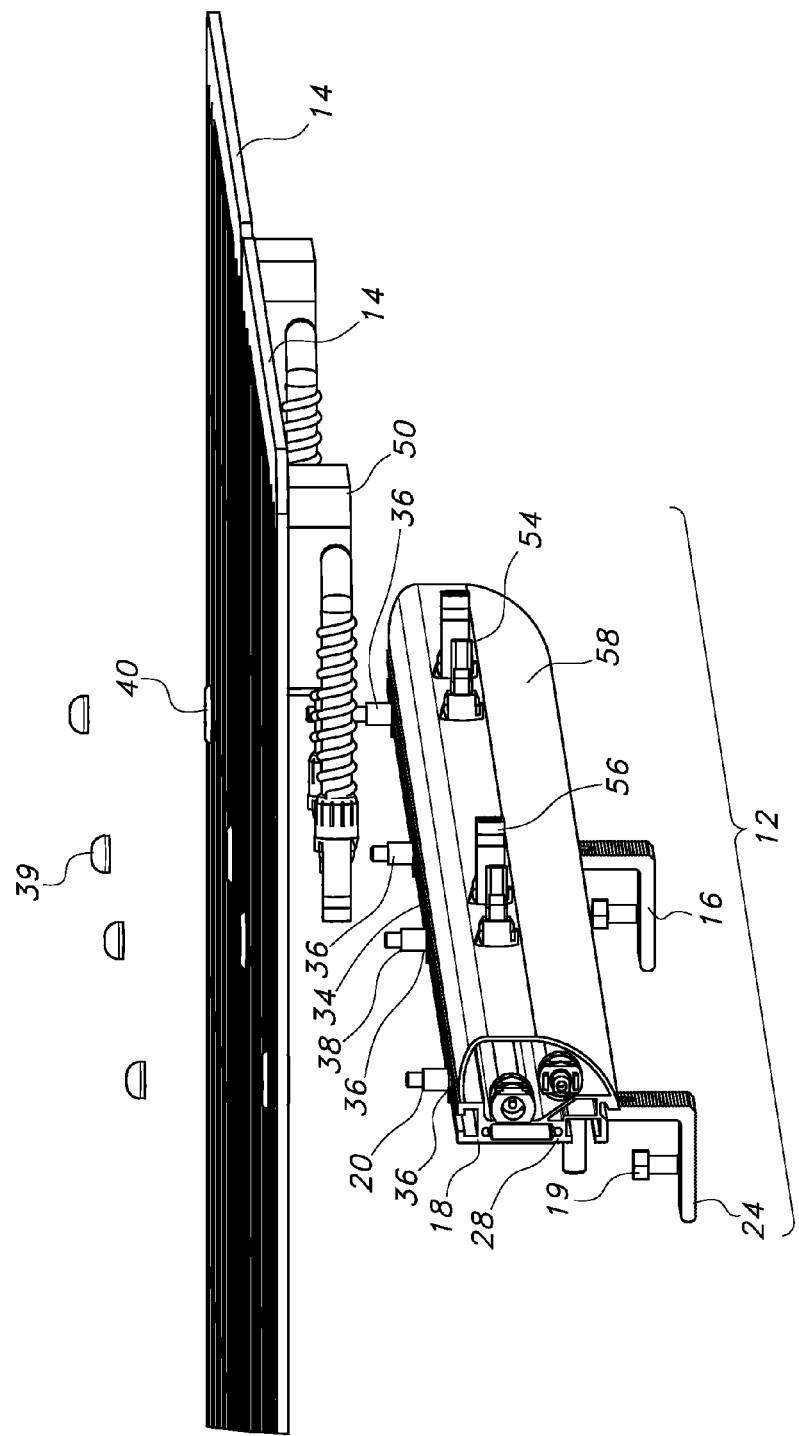
FIG. 4 depicts a side perspective view of the PV mounting system of FIG. 2 with a panel module positioned for installation on an elongate member.

Referring to FIGS. 3-4, the mounting system 10 in addition to panel modules 14 includes brackets 16, elongate members 18, and panel attachment devices 20. The brackets 16 are generally mounted to a structure (e.g., the structure 12), such as the roof of a building and are spaced at a predetermined distance from each other in a row. The brackets 16 secure the elongate members 18 to the structure 12 and provide support to the mounting system 10. The brackets 16 may be in the form of standoffs which space the elongate members from the structure 12. A plurality of standoffs 16 may be secured to the support structure 12 with mounting hardware 19. A first elongate member 18a may be coupled to a first row of standoffs 16. A second row of standoffs 16 may be secured to the support structure 12 to support a second elongate member 18b a predetermined distance from the first elongate member as shown in FIG. 3. Multiple pairs of elongate members 18 may be secured to the support structure 12. It is within the contemplation of the present invention that a panel module 14 may be supported by more than two elongate members 18. The panel modules 14 can be positioned between the spaced elongate members 18 and coupled thereto via attachment devices 20.

The standoffs 16 may have a generally L-shaped configuration including bases 24 having an elongated slot 26 for receiving mounting hardware 19. The slots 26 permit the standoffs and the elongate members 18 attached thereto to be adjusted closer or further from each other in a direction X generally perpendicular to the length of the elongate members as shown in FIG. 3. The spacing between the standoffs may be set in order to accommodate the mounting of the panel modules 14.

Figure 5:
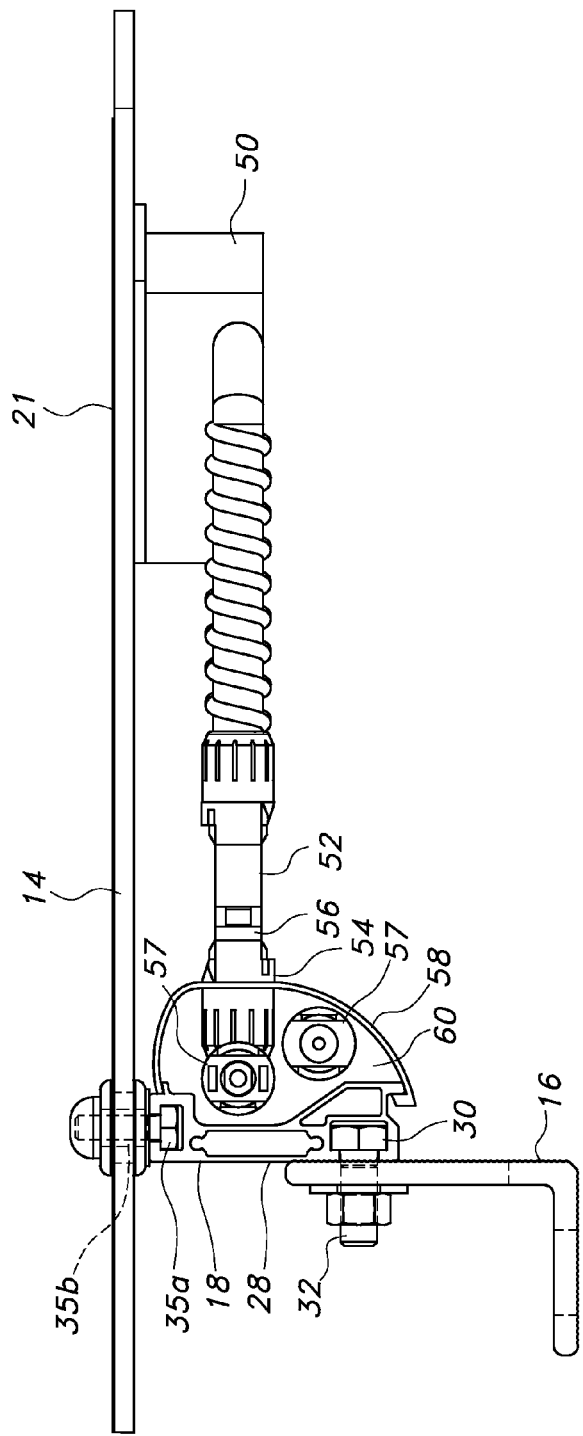
FIG. 5 depicts a side elevational view of the PV mounting system.

With reference to FIGS. 3-5, the elongate members 18 are rail-like members, with each member having the same or similar configuration. The elongate members 18 can be formed of metal via an extrusion process, although it is contemplated that other metal forming methods of the type known in the art may be used. The elongate members 18 are mounted to structure 12 via the standoffs 16 in spaced pairings such that the elongate members run generally parallel to each other. An inside face 28 of the elongate members 18 may include a T-shaped slot 30 in which the head of a fastening member 32, such as a bolt, may be inserted and slid thereal-ong. The fastening members 32 may be attached to the standoffs 16 secured to the support structure 12. As shown in FIG. 3, the elongate members 18 may be secured end-to-end by a coupling device 33.

When the elongate members 18 are attached to the standoffs 16, the fastening members 32 may be left in a loosened state in order to permit the elongate members 18 of each pairing to be slid with respect to the standoffs and each other. The sliding of the elongate members 18 allows them each to be positionally adjusted along a Y axis (FIG. 3) with respect to each other so that the elongate members 18 can be properly aligned. While both elongate members 18 may be adjustable along the Y axis, it is also within the contemplation of the present invention that in an alternative embodiment only one of the elongate members 18 is positionally adjustable with the other being non-adjustable. The correct positioning of the elongate members 18 facilitates installation of the panel modules 14 as described in further detail below. Once the predetermined proper alignment between the pairing of elongate members is achieved, the fastening members 32 may be operated on to achieve a tightened state, thereby fixing the position of the elongate members 18. When the pair of elongate members 18 are properly aligned and spaced, no further adjustments are needed to secure the panel modules 14 in place.

Figure 6:
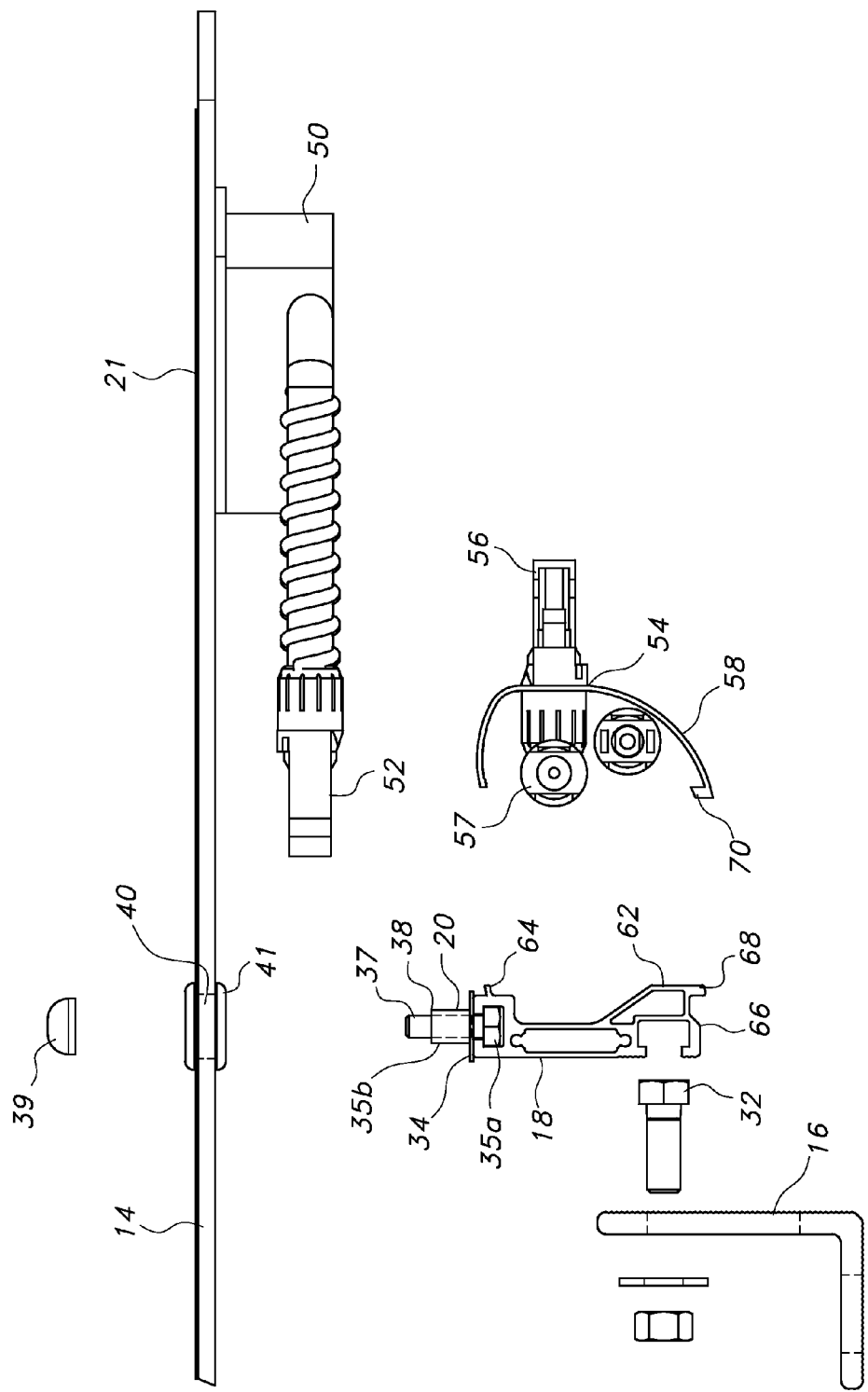
FIG. 6 depicts a side elevational exploded view of the PV mounting system.

With reference to FIGS. 4, 5 and 6, each of the elongate members 18 can have a top surface 34 which is generally planar and extends along the length of the elongate member. The top surface 34 may include a plurality of discrete mounting sites 36 spaced along the length of the elongate member. The mounting sites 36 are positionally fixed to the elongate member 18. The each mounting site 36 may include an attachment device 20 which cooperates with the panel modules 14 for securing the panel modules 14 to the elongate members 18. The attachment devices 20 can be fixedly mounted to the elongate member such that the attachment devices are immobile and cannot be moved during installation of the elongate members. In some embodiments, the attachment devices 20 may include upstanding posts 38 fixed to the elongate members 18. The posts 38 may include a threaded distal end 37 for receiving a cap nut 39. The post 38 may include a bolt 35a threaded into a sleeve 35b. The post 38 is fixed in position on the elongate member 18. The manner of fixing the post 38 to the elongate member 18 may include welding, adhesives or other means known in the art.

The panel modules 14 may include a plurality of spaced mounting holes 40 formed there-through. The mounting holes 40 may be lined with an elastomeric bushing 41. The posts 38 extend through mounting holes 40 formed in the panel modules 14 and the cap nuts 39 are threaded onto the posts to secure the panel modules. The mounting holes 40 can be positioned inward from the perimeter of the panel modules 14 so that when the panel modules 14 are secured to the elongate members 18, the panel modules 14 extend beyond the elongate members in the X direction. This allows the panel modules 14 to overhang the elongate members 18 to reduce exposure to the elements of the elongate members 18 and/or wires and electrical connections.

With further reference to FIGS. 3 and 4, the mounting sites 36 are disposed on the elongate members 18 at fixed locations. The spacing between the mounting sites 36 is such that when the elongate members 18 are aligned in a predetermined manner, the mounting sites 36 on one elongate member 18 cooperate with the mounting sites 36 on the other elongate member to form a plurality of mounting site sets 42. One set 42, for example, includes mounting sites 36a, 36b, 36c and 36d. Each mounting site set 42 corresponds to a set of mounting holes 40 in a panel module 14. The sets of mounting sites 42 are spaced so that the panel modules 14 can be secured to the elongate members 18 in a side-by-side arrangement as shown in FIG. 1. Therefore, when a first panel module 14 is installed, the panel mounting holes 40 align with a first set of mounting sites on the elongate members 18. When a second panel module 14 is to be installed next to the first installed panel, the mounting holes 40 in the second panel will align with a second set of mounting sites on the elongate members. Subsequent panel members 18 may installed side-by-side on the elongate members 14 forming the panel array 17 as shown in FIGS. 1 and 2. A set of mounting sites 42 may include 4 mounting sites with two of the mounting points being in each elongate member. However, it is within the contemplation of the present invention that the number of mounting sites may vary.

Accordingly, once the elongate members 18 are properly aligned with each other, the mounting sites 36 are properly indexed along the length of the elongate members so that the panel mounting holes 40 and the mounting sites 36 of the elongate members 18 will align, thereby permitting the array of panel modules 14 to be installed and secured. Since the mounting sites 36 are fixed to the elongate members 18, no adjustment of these sites 36 relative to the elongate member 18 is required for mounting the panel modules 14 or for removing the panel modules. In addition, after alignment of the elongate members 18, no further adjustment to the positioning of the panels 14 or of the elongate members is required. An installer can easily and efficiently secure one panel module 14 after the other to the aligned elongate members.

Figure 7:
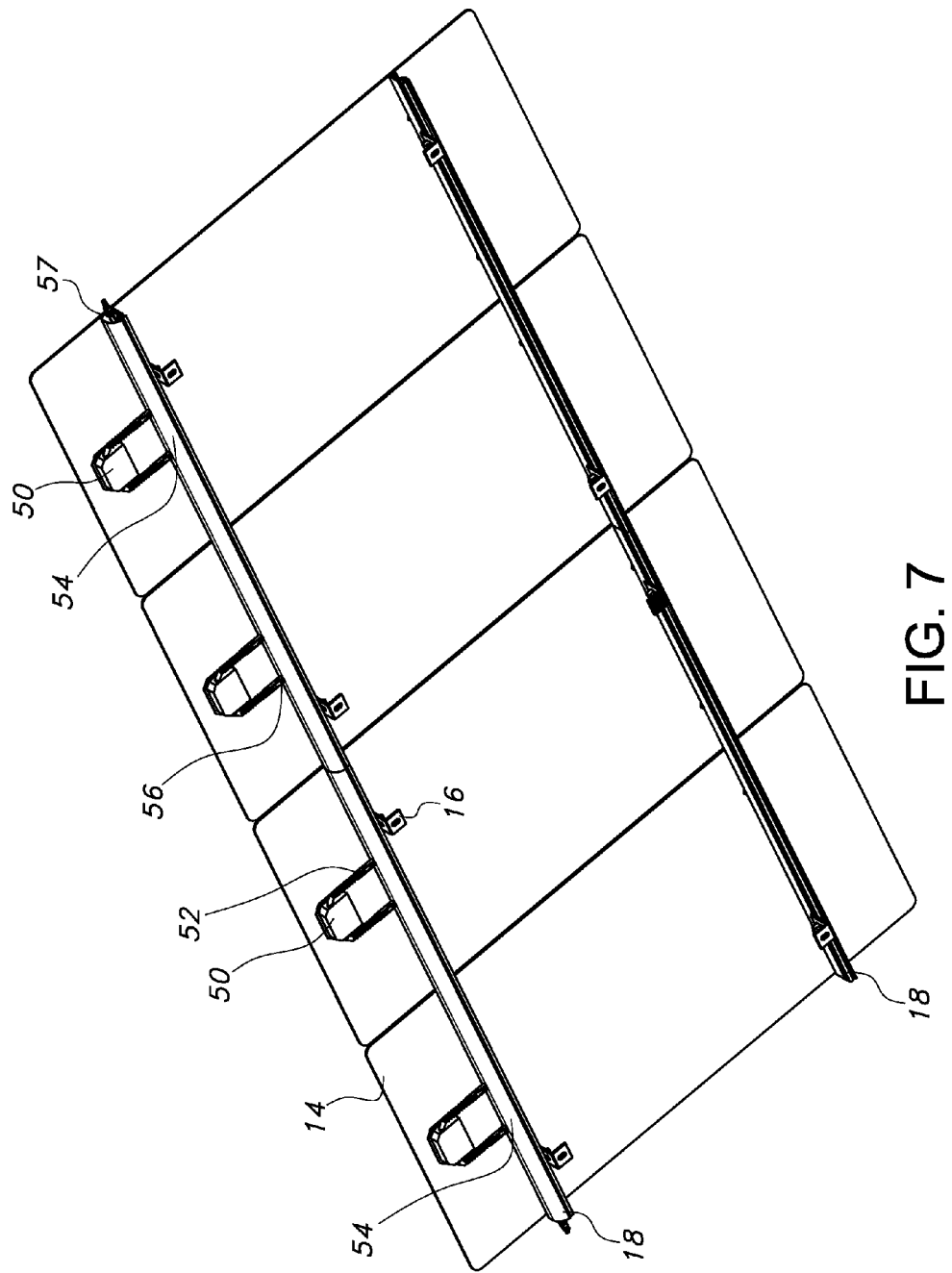
FIG. 7 depicts a bottom perspective view of the PV mounting system.

The elongate members 18 also facilitate efficient installment of the electrical wiring running from the panel modules 14. With reference to FIGS. 5-7, the panel modules 14 may include a module junction box 50 disposed on the underside of the panel modules 14. The junction box 50 provides a termination point for the individual photo cells which make up the PV panel 21 and allows the electricity generated by the PV panel to be distributed. The junction boxes 50 may include box connectors 52 which permit the panel modules 14 to be connected together. The panel modules 14 may be electrically connected in series and/or parallel in order to achieve a desired output voltage and/or current. The panel modules 14 can be then ultimately electrically connected to the electrical service of the residence or building so that the electricity produced by the PV panels 21 of the panel modules 14 can be utilized.

The panel modules 14 are secured to the elongate members 18 such that the junction boxes 50 are positioned adjacent the same elongate member. In order to electrically interconnect the panel modules 14, at least the elongate member adjacent the junction boxes 50 may include a plurality of electrical connection stations 54, with a station provided for each PV panel. Each connection station 54 includes electrical module connectors 56 which connect to the box connectors 52 of the panel modules 14. The module connectors 56 can be flexible wiring connectors and/or rigid connectors. The connection between the junction box 50 and the module connectors 56 can permit the panel modules 14 to be easily connected and disconnected, e.g., plugged and unplugged, from the wiring to facilitate ease of installation and/or disassembly.

Wiring 57 from the module connectors 56 can run along the length of the elongate member to a termination point. The wiring on the elongate members 18 can be pre-installed. Therefore, an installer would need only to connect the junction box 50 to the module connectors 56 to make the electrical connection for the panel modules 14. In order to provide a protected path for the wiring 57, a wireway 58 can be included on the elongate member adjacent the junction boxes 50. The wireway 58 may include the connection stations 54 thereon. The wireway 58 may be a generally C-shaped member and when connected to the elongate member 18 forms an enclosed conduit 60. The wireway may be formed of metal, plastic, or other material, such as a carbon composite. The wireway 58 may be formed such that it clips onto the elongate member 18. In order to facilitate this attachment, an outer surface 62 of the elongate member may include an outwardly extending ridge 64 and an elongate member bottom surface 66, which may include a downwardly projecting rim 68. The wireway may include hook-shaped lip 70 extending along one end which engages the rim 68. The other end of the wireway 58 may slip over the ridge 64, thereby securing the wireway 58 to the elongate member 18. It is within the contemplation of the present invention that the wireway may be attached to the elongate members in a number of ways including by the use of fasteners, such as screws and/or bolts.

In some embodiments, an array of panel modules 14 can be electrically connected using a common ground or reference line. The power line can be divided into segments to connect the positive terminal of a panel module to the negative terminal of another panel module. As such, an array of panel modules can be electrically connected in a cascading manner where the outputs (positive terminals) of a panel module serve as inputs (negative terminal(s)) for the next panel module in the array.

For embodiments in which the panel modules 14 are electrically connected in a cascading manner an elongate member can be fabricated with the necessary wiring. For example, a ground or reference line can extend in the wireway 58 of the elongate member from one end of the elongate member to the other end as a continuous uninterrupted wire. Each end of the reference line can include a termination point having an electrical connector so that when the elongate members are installed, the electrical connectors at the terminal points of the reference line can be connected using the electrical connectors.

Likewise, an elongate member 18 can be fabricated to include the supply line in the wireway 58 of the elongate member. The supply line can be composed of separate discontinuous segments of wire. The segments can begin at one end of the elongate member with a terminal point having an electrical connector end and can extend to the first one of the module connectors 56 of the elongate member. The next segment can begin from the second one of the module connectors 56 and can extend to the next one of module connectors 56 of the elongate member. The last segment can extend from the last module connector 56 of the elongate member to a terminal point at the other end of the elongate member, which can include an electrical connector. In this manner, the supply line of the elongate member can be electrically connected to other elongate members by connecting the terminal points. By fabricating the elongate members with the wiring for electrically connecting the elongate members together via the terminal points, the time and complexity of installing the elongate member and the panel modules 18 on a structure 12 can be reduced.

Wires 57 interconnecting the various panel modules 14 may be run through the conduit 60 created between the wireway 58 and the elongate members 18 as shown in FIG. 5. The wireway 58 permits the wires 57 to be neatly run in a path and facilitates ease of installation. The wireway 58 also protects the wires 57 from the elements, ultraviolet radiation, and rodents. Removal of the wireway allows easy access to the wiring and/or connectors to facilitate installation and/or maintenance.

Figure 8:
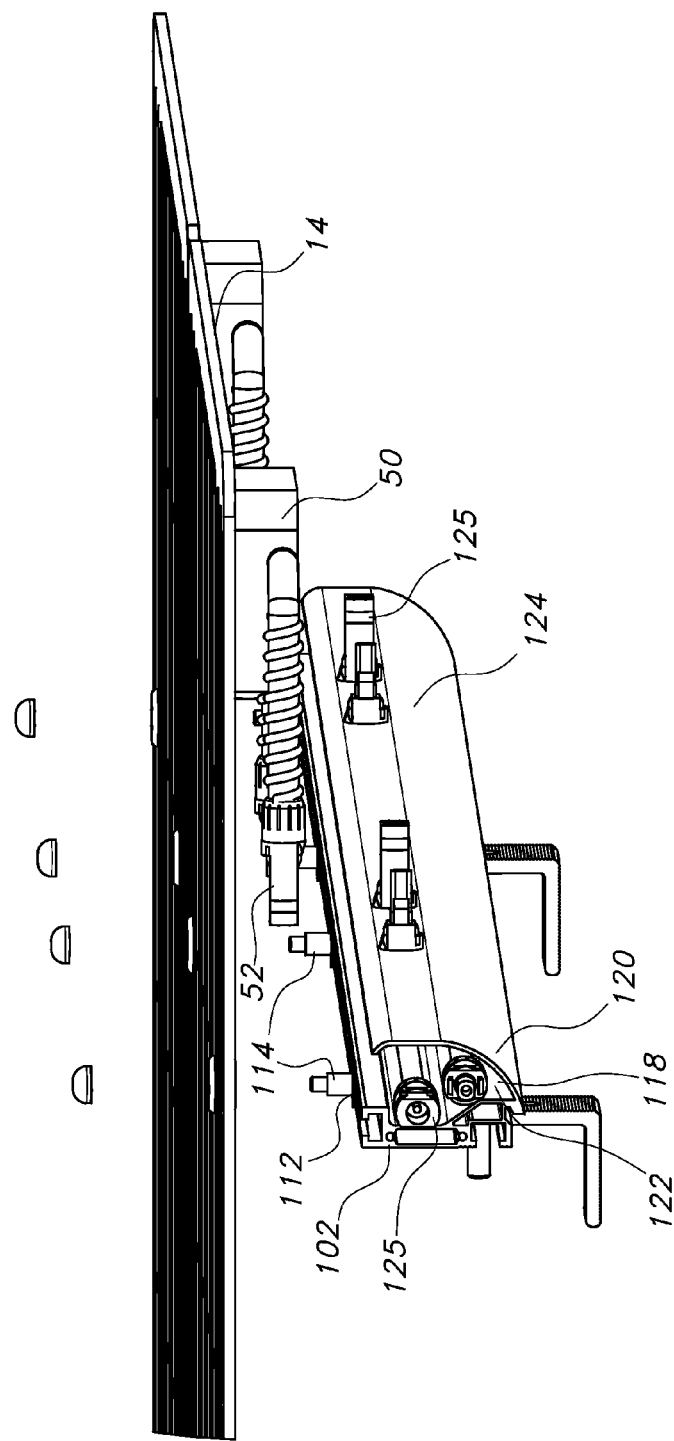
FIG. 8 depicts a side perspective exploded view of an alternative embodiment of a PV mounting system.

With reference to FIG. 8, an alternative embodiment of the elongate members is shown. The elongate members 102 may be formed in a manner similar to the embodiment described above, except for the wireway being integrally formed as part of the elongate member. The elongate members 102 may include a top surface 110 having a plurality of fixed mounting sites 112 spaced along the length of the elongate member. Each mounting site may include an attachment device 114 which cooperates with the panel module 14 for securing the panel modules 14 to the elongate members 102. At least one of the elongate members 102 may include a generally U-shaped conduit 118 extending along its length. The conduit 118 may be integrally formed as part of the elongate members, such as by an extruding process. The conduit 118 may be formed by a wireway including a wall structure 120 extending from the bottom of inside face 122 and around a back of the elongate member. The wall structure may form the outer surface 124 of the elongate member.

The conduit 118 defines a passage through which wiring 125 from the panel modules 14 may extend. The conduit 118 may be open along the top to permit access to the wiring and module connectors. The opening is covered when the panel module 14 is installed on the elongate members due to the overhang of the panel modules 14. In one embodiment, both elongate members supporting the panel module 14 may include the conduit. Accordingly, only one type of elongate member would need to be used for a particular installation job. Alternatively, only one of the pair of elongate members 102, e.g., the elongate members adjacent the junction box, may include a conduit.

At predetermined locations along the length of the elongate member, module connectors 125 may be secured to the wall structure and extend outwardly therefrom. The module connectors 125 are located so that they will align with the panel module box connectors 52 to which they are secured.

Figure 9:
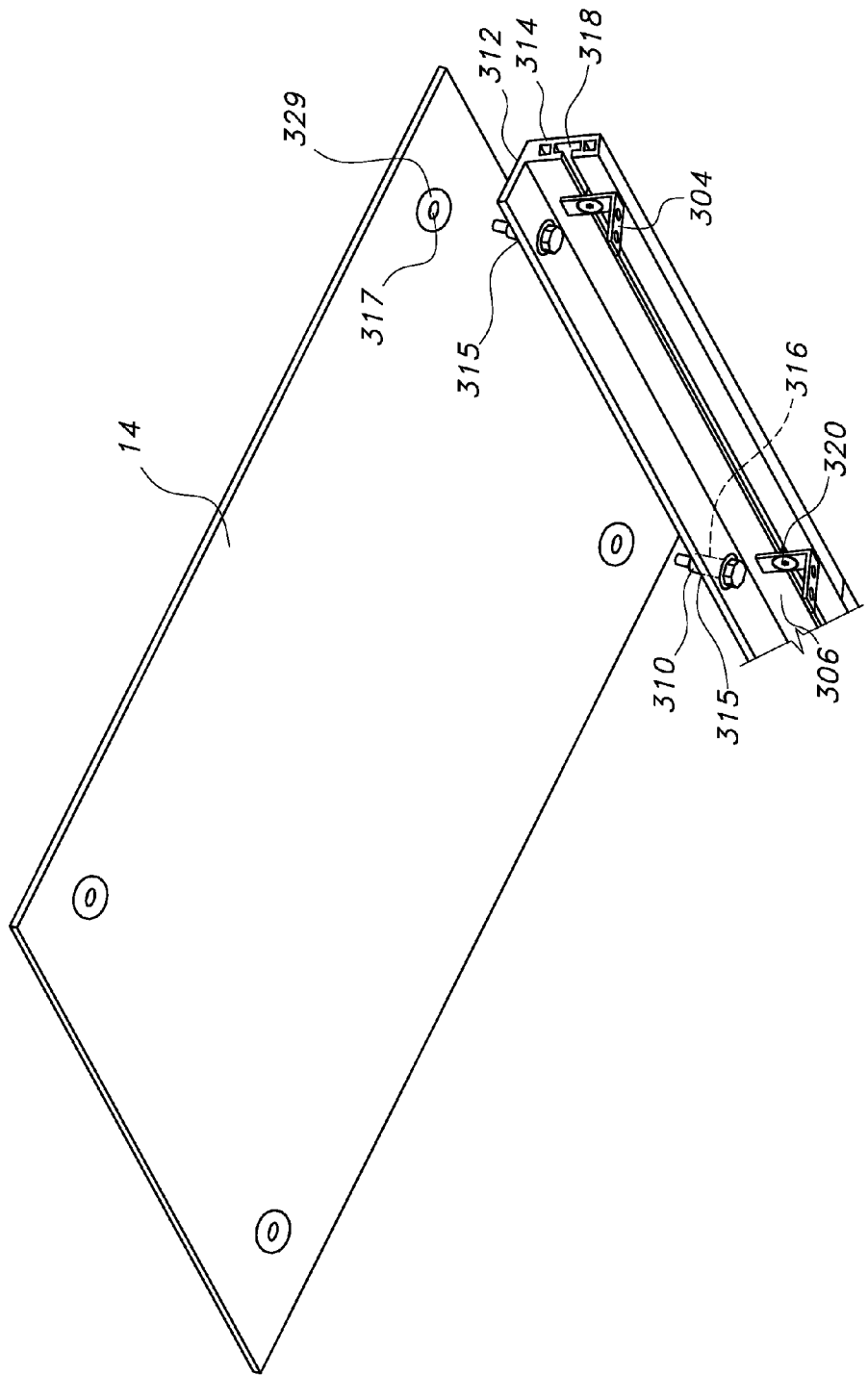
FIG. 9 depicts an exploded perspective view of a further alternative embodiment of a PV mounting system including a partial view of an elongate member.
Figure 10:
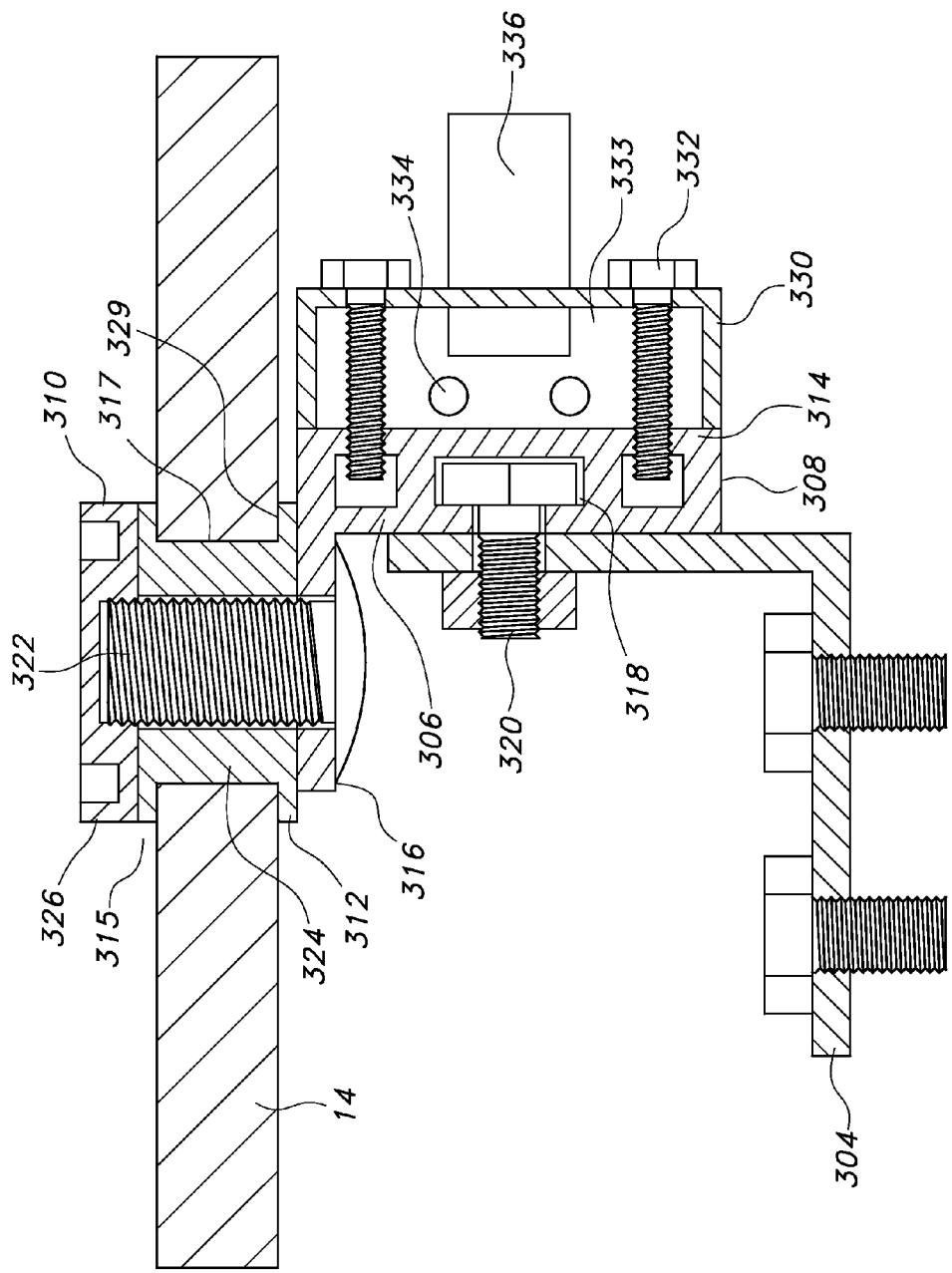
FIG. 10 depicts a partial cross-sectional side view of the mounting system of FIG. 9.

With reference to FIGS. 9 and 10, a further embodiment is shown. The elongate members 306 have a generally L-shaped configuration and include an upper portion 312 and a downwardly depending body portion 314 which all extend along the length of the elongate member 306.

The upper portion 312 preferably includes a planar upper surface that extends longitudinally along the length of the elongate member 306. The upper portion 312 of the elongate member 306 preferably has multiple spaced mounting sites 315 in the form of mounting openings 316 formed therein. The openings 316 can be, for example, holes or slots that facilitate coupling of panel modules 14 to the elongate member 306. The openings 316 may be spaced at predetermined distances to correspond to mounting holes 317 in the panel modules 14 when the pair of elongate members 306 is in alignment with each other. In this manner, the openings 316 can be indexed to panel module mounting holes 317 so that the panel module 14 can be secured to the elongate members 306 via attachment devices 310.

Body portion 314 extends along the length of an elongate member 306 and is generally configured orthogonally to the upper portion 312. A channel 318 is formed in the portion 314 and extends longitudinally along the length of the body portion 314 to provide an area for receiving mounting hardware 320 to secure the elongate member 306 to standoffs 304. The channel 318 allows the elongate members 306 to slide in their longitudinal direction before being fixedly positioned. As a result, the elongate members 306 can be aligned with each other so that the openings 316 and attachment devices 310 secured therein align with the panel module openings 317 to facilitate securing the array of panel modules 14 to the elongate members 306. Once the elongate members 306 are properly aligned, they can be rigidly secured to the standoffs 304 by tightening fasteners 320. Each pair of elongate members 306 may support one or more panel modules 14. It is within the contemplation of the present invention that a panel module may be supported by more than two elongate members.

The panel modules 14 are secured to the elongate members 306 by one or more attachment devices 310 located at mounting sites 315. With reference to FIG. 10, the attachment devices 310 preferably include bolt 322, a threaded sleeve 324, and a nut 326. In one embodiment, the attachment devices 310 are fixedly attached to the elongate members 306. In the present example, the bolts 322 from multiple attachment devices 310 are inserted into the openings 316 of the elongate member 306 such that the bolts 322 extend through the openings from the bottom side of the upper portion 312. The threaded sleeve can threadingly engage the threaded rod portion of the bolt on the top side of the upper surface to fixedly secure the bolt 322 to the elongate member 306. The threaded sleeve preferably has a cylindrical configuration; however, those skilled in the art will recognize the sleeve can be formed using other configurations, such as a rectangular prism, cube, or hexagonal prism. The panel module mounting holes 317 may be configured based on the configuration of the sleeve 324. For example, if the sleeve is configured as a rectangular prism the panel module holes 317 can be rectangular.

Once the bolts 322 and sleeves 324 are fixed to a pair of elongate members 306, the panel module 14 can be aligned so that the panel module mounting holes 317 align with the openings 316, and therefore, the bolts 322 and sleeves 324 also align. The panel module 14 can be moved toward the upper portion 312 of the elongate member so that the bolt and sleeve extend into the panel module mounting holes 317. After the panel module is positioned, the nuts 326 can be used to secure the panel module 14 to the pair of elongate members 306 by threadingly engaging with an exposed threaded portion of the bolts 322. In a preferred embodiment, the nut 326 is a tamper proof nut that cannot be removed without the use of a special tool. In an alternative embodiment, the bolt may be fitted to a bushing which is press-fit in to the elongate member openings.

The panel module mounting holes 317 may be lined using a resilient material 329, such as grommets formed from a polymer (e.g. rubber) to provide a snug but flexible fit for the attachment devices 310, as well as to protect the panel modules 14 from being damaged by the attachment devices 310.

In other embodiments (not shown), the bolt and sleeve can be fixed to the panel module 14 via panel module openings 317. Subsequently, the panel module 14 can be aligned so that the openings of the elongate members 306 can receive an exposed threaded portion of the bolts 322. The nut 326 then may be secured to the exposed threaded portion of the bolts 322 at the bottom side of the upper surface 312 of the elongate members 306 to fixedly secure the panel module 14 to the elongate members 1306.

As in the embodiments described above, the elongate members 306 may have attached to a rear surface thereof a wireway 330. The wireway 330 may be secured to the back side of the elongate member by way of threaded fasteners 332 as shown in FIG. 10. The wireway 330 may be a generally C-shaped member and when connected to the elongate member 306 forms an enclosed conduit 333. Wires 334 interconnecting the various panel modules may be run through the conduit 333 created between the wireway and the elongate members. The wires 334 may be operatively attached to electrical connectors 336. Electrical connectors 336 connect to junction box connectors disposed on the undersurface of the panel modules 14 panels in order to provide a way of easily interconnecting the various panels to each other.

A further alternative embodiment of the panel mounting system is shown in FIGS. 11-21. The elongate member 500 may include an upper portion 502, a connecting portion 506, and a downwardly depending flange 510 (hereinafter "flange 510") which all extend along the length of the elongate member 500. In one embodiment, the elongate member 500 generally has a question mark-like cross-sectional configuration.

Figure 12:
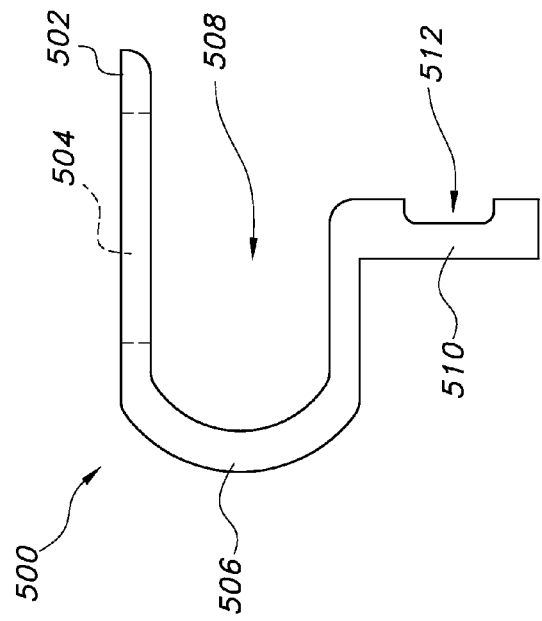
FIG. 12 depicts an end view of an elongate member of FIG. 11.
Figure 11:
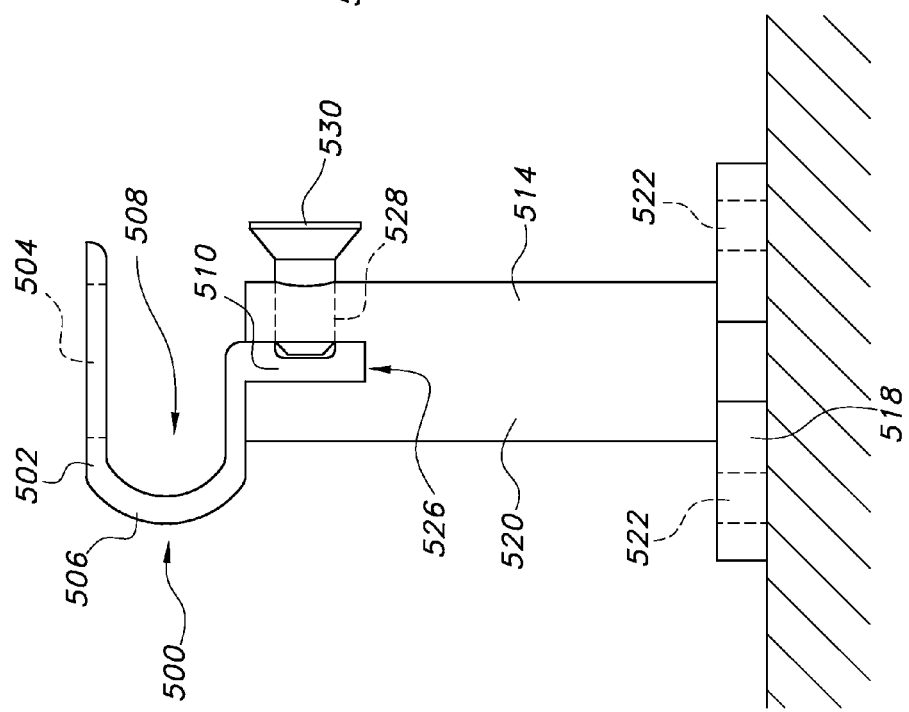
FIG. 11 depicts still a further alternative embodiment of a PV mounting system including an end view of an elongate member coupled to a bracket.
Figure 13:
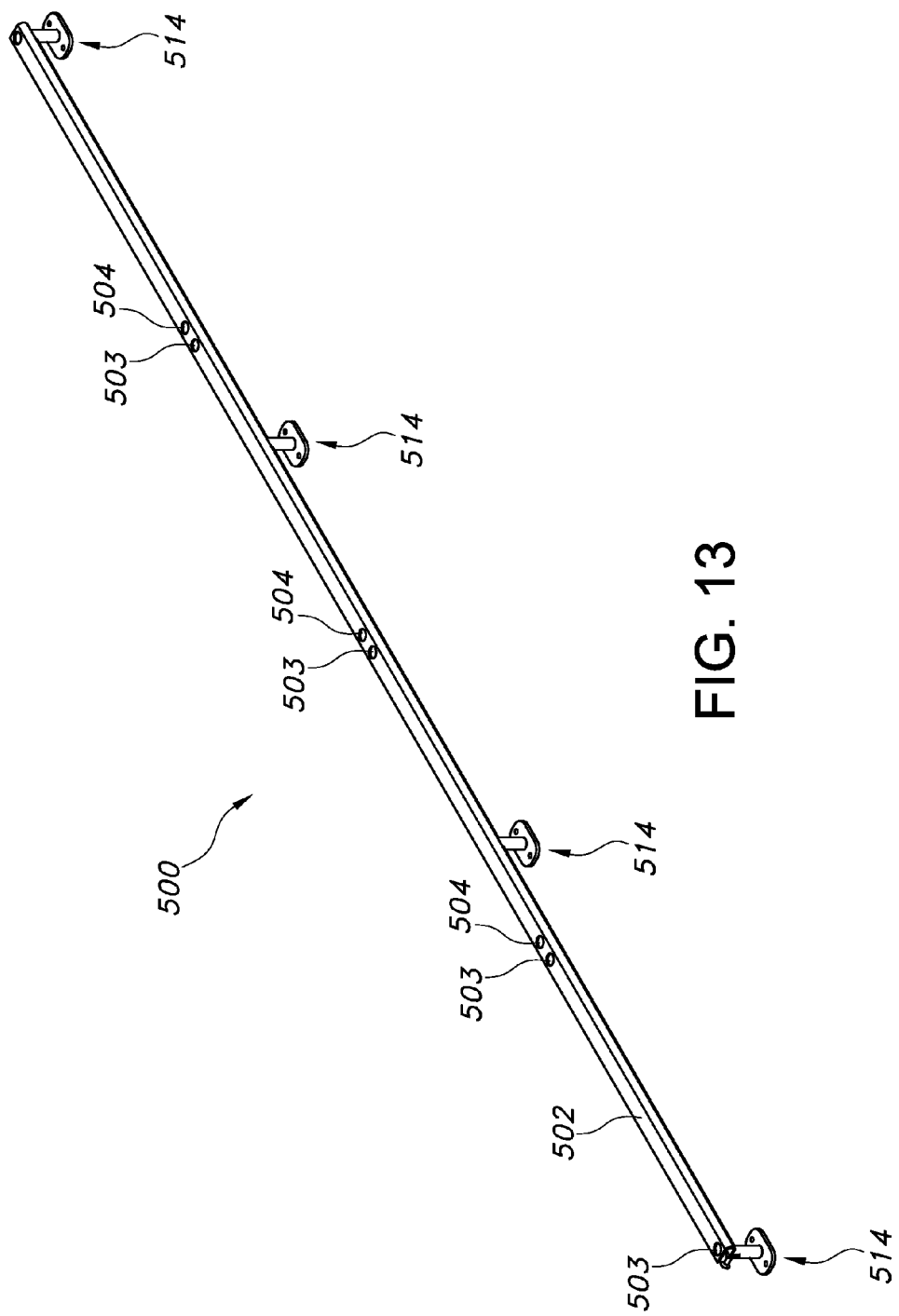
FIG. 13 depicts a perspective view of the elongate member of FIG. 11 coupled to a plurality of brackets.

With reference to FIGS. 11-13, the upper surface 502, extending longitudinally along the length of the elongate member 500, may have multiple mounting sites 503 in the form of mounting openings 504 formed therein. The openings 504 can be, for example, holes or slots. The openings 504 facilitate the coupling of panel modules 507 (FIG. 18) to the elongate member 500. The openings 504 can be spaced at predetermined distances so that the panel modules 507 can be secured to the elongate members 500 via attachment devices 511 (FIG. 14). The openings can have longitudinal width that is slightly greater than the width of the attachment devices or may have a longitudinal width that allows the attachment devices to slide in the longitudinal direction. The openings 504 can be arranged on the upper surface 502 so that they correspond to the transverse distance between attachment devices 511 that are connected to the panel modules 507 (FIG. 18). In this manner, the openings 504 and the attachment devices 511 for connecting the panel modules 507 to the elongate members 500 are pre-aligned in the transverse direction which corresponds to the width of the panel modules.

With reference to FIG. 12, the connecting portion 506 preferably extends along the length of the elongate member 500 and connects the upper surface 502 to the flange 510. The connecting portion 506 can be a curved, C-like section that forms a longitudinally extending channel 508. The channel provides clearance for a portion of the attachment devices 511 when they are inserted in the elongate member 500, as discussed below. The channel 508 may also provide an area for routing, holding, and protecting wires that connect to the panel modules 507.

The flange 510 extends along the length of an elongate member 500 and is generally configured orthogonally to the upper surface 502. A groove 512 is formed in the flange 510. The groove 512 extends longitudinally along the length of the flange 510 and provides an area to receive mounting hardware 513 (FIG. 11) to secure the elongate member 500 to standoffs 514. The orientation of the groove 512 and the channel 508 can be substantially identical so that the groove 512 and the channel 508 are formed to open in the same direction.

With reference to FIG. 11, the standoff 514 may have a generally rod rod-like configuration. Alternatively, the standoff 514 can be implemented with other configurations and shapes. The standoff may include a base plate 518 and a shaft portion 520. The base plate 518 and the shaft portion 520 may be manufactured as a single unitary structure, or may be manufactured as separate components that can be coupled together with fastening hardware or other connection devices to form the standoff 514.

The base plate 518 of the standoff 514 can include openings 522 for receiving fastening hardware (not shown), such as screws or bolts, for securing the standoff to the structure. A distal end of the shaft 520 can include a slot 526 formed therein and a threaded opening 528 running transverse to the direction of the slot 526. The slot 526 is configured to receive elongate member flange 510. The elongate member 500 can be secured in the slot 526 using mounting hardware 530, such as a set screw.

To connect the standoff 514 and the elongate member 500, the flange 510 of the elongate member 500 is disposed in standoff slot 526. The depth of the slot 526 may be such that when the flange 510 sits on the bottom of the slot 526, the groove 512 generally aligns with the opening 528. The elongate members 500 may be slide with respect to the standoffs so that the members may be properly aligned to mount the panel modules. Once the proper alignment is achieved, the elongate members 500 may then be secured to a standoff 514 by the insertion of mounting hardware 530, which extends through the opening 528 at the distal end of the standoff 514 and engages the groove 512. Since the end of the mounting hardware 530 engages the groove 512 of the flange 510, removal of the elongate member 500 in the longitudinal direction of the standoff 514 is prevented. Therefore, forces, such as those caused by wind, tending to separate the elongate members, and panel module secured thereto, from the support structure are resisted.

With the elongate members 500 secured, the panel modules 507 may be selectively locked to the elongate members 500 by one or more attachment devices 511. The attachment devices permit attachment of the panel modules to the elongate members 500 without tools. With reference to FIGS. 14 and 15, each attachment device 511 may include a housing member 710, a resilient locking member 730, a resilient ring 750, a bolt 770, a washer 780, and a nut 790. The housing member 710 may be configured in a generally cylindrical manner. The housing member 710 may have a sidewall 712, a top surface 714 and a bottom surface 715 that is similar to the top surface 714. The sidewall 712 extends radially about a longitudinal axis of the housing member 710 and has an opening 716 formed therein for receiving a portion of the resilient locking member 730. The top surface 714 and bottom surface 715 may include openings 718 for receiving bolt 770 therethrough.

The resilient locking member 730 has a generally curved or C-shaped configuration having a curved portion 732 extending radially about a longitudinal axis of the resilient locking member 730. The resilient locking member 730 is configured to be inserted into the housing member 710. The curved portion 732 may generally resist being compressed in a radially inward manner and may be composed of a steel spring. The resilient locking member 730 can include a raised portion 734 disposed on the curved portion 732, which forms a locking member of the attachment assembly 511 for selectively locking the panel modules 507 to the elongate members 500. The raised portion 734 can be configured to engage and extend through the opening 716 of the housing member 710 so that the raised portion 734 protrudes from the housing member 710 when the resilient locking member 730 is inserted into the housing member 710. The resilient locking member 730 tends to urge the raised portion 734 in an outwardly extending position through the opening 716 of the housing member 710. The raised portion 734 can have a ramp-like end 736 such that a bottom portion 738 of the raised portion 734 extends away from the curved portion 732 to a distance that is less than the distance that a top portion 740 extends away from the curved portion 732.

The resilient ring 750 is an annular member having an opening 752 there through which the bolt 770 may extend into. The resilient ring 750 can be formed of a resilient material that can be slightly compressed under the exertion of a compressive force, but that generally resists such compression. The resilient ring 750 may be aligned adjacent to the housing member 710 so that the opening 718 of the housing member 710 substantially aligns with the opening 752 of the resilient ring 750.

The bolt 770 can extend through the openings 718 in the top surface 714 and the bottom surface 715 of the housing member 710, the opening 752 of resilient ring 750, and an opening in the washer 780. A distal end 772 of the bolt 770 can engage the nut 790 to secure the housing member 710, the resilient ring, and the washer 780 of the attachment assembly 511 to the panel module 507.

Referring to FIGS. 16 and 17, another embodiment of an attachment assembly 800 is provided. The attachment device 800 can include a housing member 810, a rod 830, and a resilient locking member 850. The housing member 810 preferably has a generally parabolic or conical configuration and is preferably formed from a co-molded plastic. The housing member 810 can have a first end 812 and a second end 814. The second end 814 can include a surface 818 for closing the housing member 810. The surface 818 preferably includes an opening 820 for receiving the rod 830. The housing member 810 preferably includes one or more openings 816, which may be formed towards the second end 814 of the housing member 810.

The rod 830 preferably has a distal end 834 and a proximate end 836. A threaded section 838 is preferably formed at the distal end 834 for threadingly engaging a bolt or the panel module. The proximate end 836 can be coupled to the resilient member 850 using a fastening mechanism, such as a press fit connection formed by a rivet, a weld, or a screw.

The resilient locking member 850 is preferably formed from a resilient material, such as a steel spring, so that absent any external forces, the resilient locking member 850 tends to return to its natural state. The resilient locking member has a longitudinally extending body 852 with a first end 854 and a second end 856. As discussed above, the resilient member 850 can be coupled to the threaded rod 830. When the attachment device, is assembled the resilient locking member 850 and the proximate end 836 of the rod 830 can be inserted into the housing member 810 towards the first end 812. During insertion, the resilient member 850 can bend inwardly towards the rod 830. The resilient locking member 850 generally resists bending inwardly, but is held in place by the housing member. The first and second ends 854 and 856 of the resilient locking member 850 can extend through the openings 816 of the housing member so that the first and second ends 854 and 856 protrude from the housing member 810. Alternatively, the resilient locking member 850 can be pre-formed to fit within the housing member in its natural state so that the housing member does not force, or applies only a small force, to the resilient locking member 850.

Elongate members may have openings formed therein to accept the housing member 810. In order to attach the panels to the elongate members, the conical housings are pushed into the openings until the locking member ends 854 and 856 go through. The end will then spring out thereby retaining the attachment device and the panel secured thereto to the elongate members. A resilient ring 870 may be disposed between the panel frame and the elongate member in order to keep tension on the locking member ends 854 and 856 and create a tight attachment.

In the embodiments described above, the mounting holes are formed in the PV panel itself, therefore, no panel frame is needed. However, it is also within the contemplation of the present invention, that the panel module may include a frame which holds the PV panel. The frame may then be attached to the elongate members. As shown in FIGS. 18 to 20, the panel module 507 may includes frame members 910, support members 930, and a PV panel 950. The frame members surround the perimeter of the PV panel 950 and retain the edges of the panel. Frame members 910 may have a lip 912, a notched section 914, a slotted section 916, and a bottom section 918. The lip 912 and the notched section 914 provide a region on the frame members 910 for supporting the PV panel 950. The PV panel 950 can be inserted into the notched section 914 and can be pressed against the lip 912. Once in place, the PV panel 950 can be secured using the support members 930, as discussed below. The slotted section 916 can be formed in the frame members 910 to provide an area for a portion of the attachment device 511 to extend into. The bottom section 918 can be adjacent to the slotted section 916 and can have a generally planar bottom surface 920. The bottom section 918 can have an opening 922 for receiving and being secured to the attachment device 511.

The frame member 910 may further include a longitudinally extending channel formed by the slotted section 916. The openings 922 can be formed in the bottom section 918 transverse to the channel formed from the slotted section 916. The channel receives the end of the bolt and allows access to a fastening element such as a nut. In a preferred embodiment, four attachment devices 511 are attached to each PV panel 950, although more or less attachment devices 511 could be used. The distance between the elongate members 500 secured to a support structure is preferably set such that the distance between the mounting openings 504 of one elongate member to an opposing elongate member equals the distance between the mounting devices 511 on the panel modules 507 in order to facilitate attachment of the panel modules 507 to the elongate members 500.

The support members 930 can be attached to the frame members 910 using any mechanism for attaching, such as adhesive, screws, nails, nuts and bolts, etc. The support members 930 can be attached to the notched section 914 of the frame members 910 so that a portion of the PV panel 950, such as a perimeter of the PV panel is sandwiched between the lip 912 of the frame member 910 and the support member 930.

The panel members are made of a natural substance such as wood. Laminated bamboo has been found to provide desirable benefits. It is, however, within the contemplation of the present invention that the frame may be made of a plastic or a metallic material. With regard to a metallic frame such as aluminum, since a metallic frame conducts electricity, it is required under various building codes that the frame be grounded. The connection of grounding wiring to each panel is time consuming and expensive. Accordingly, the use of an insulating material such as wood eliminates the need to include such electrical grounding structure. Furthermore, the use of laminated bamboo can be made in an environmentally conscious manner eliminating negative environmental impacts associated with the production of the system.

Figure 21:
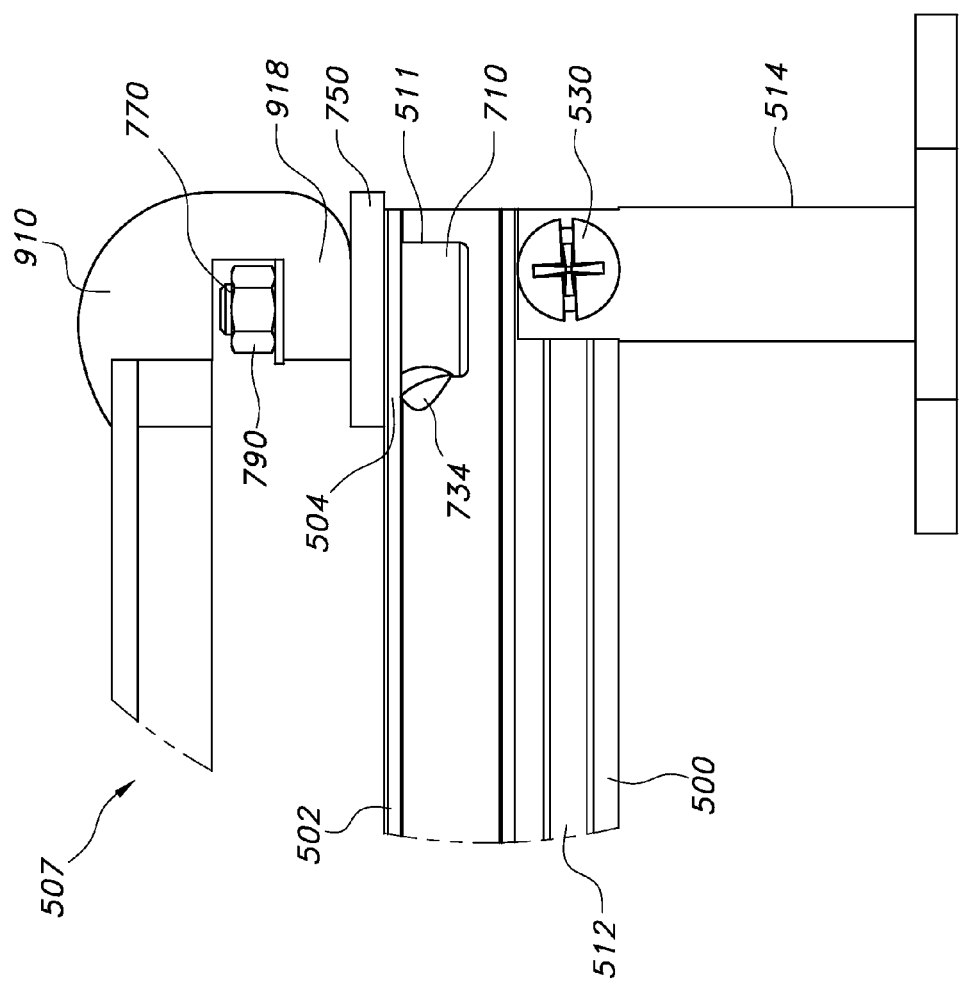
FIG. 21 depicts an exemplary PV mounting system after interconnecting the PV panel modules to the elongate members.

FIG. 21 depicts an exemplary connection of the panel module 507 and the attachment device 511. The attachment device 511 can be secured to the frame member 910 of the panel module 507 using the bolt 770 and nut 790 of the attachment device 511. Multiple attachment devices 511 can be secured to the panel module 507. In an exemplary embodiment, four attachment devices 511 can be secured to each panel module 507.

To secure the panel module 507 to the elongate members 500, the attachment devices 511 are secured to the panel module 507. The elongate members 500 are aligned and secured to the standoffs 514 to prevent any further movement. The attachment devices 511 are placed in line with the openings 504 in the upper surface 502 of the elongate members 500. The elongate members having been previously aligned, the position of the openings 504 correspond to the position of the attachment devices 511. The housing members 710 of the attachment devices 511 are inserted through the openings 504. While the housing members 710 are being inserted, the raised portion 734 of the resilient members deflect radially inwardly so that the housing members 710 fit through the openings 504. Once the housing members 710 and raised portions 734 are passed the thickness of the upper surface 502 of the elongate members 500, the raised portions 734 re-extends radially outwardly to selectively lock the attachment device 511 in the elongate member 500. The panel module 507 is thereby secured to the elongate members 500. A second panel module may be secured to the elongate members 500 adjacent to the first panel module in a similar manner. Since the elongate members are aligned all the openings 504 along the length of the elongate members are properly aligned to receive the attachment devices 511 of the panel modules. If removal of a panel module 507 is desired, an installer simply needs to reach underneath the panel module 507 and engage the raised portions 734 pressing them inwardly to unlock the panel modules 507 and to lift on the panel module 507. Therefore, the panel modules 507 may then be selectively locked to the elongate members 500 without requiring the use of tools.

As shown in FIG. 21, the resilient ring 750 may be compressed between the upper surface 502 of the elongate member 500 and the bottom section 918 of the frame member 910 to allow the housing member and the raised portion 734 to pass the thickness of the upper surface 502 of the elongate member 500. The resilient ring can remain slightly compressed between the bottom section 918 of the frame member 910 and the upper surface 502 of the elongate member 500. Once the housing member is inserted, the raised portion 734 extends beyond a radial distance of the opening 504 and effectively secures the panel module 507 to the elongate member 500. The resilient ring 750 can remain slightly compressed so that the attachment device 511 securely locks the panel module 507 to the elongate member 500. The resilient ring 750 also accommodates for thermal expansion of the various components and various manufacturing tolerances.

In an alternative embodiment (not shown), the attachment devices 511 may be secured to the elongate member 500 at the mounting sites 503 and the panel modules may include openings for receiving the attachment assemblies. In addition, the attachment devices 511 and 800, may be use with frameless panel modules and secured to mounting openings formed in the PV panel.

Having described the preferred embodiments herein, it should now be appreciated that variations may be made thereto without departing from the contemplated scope of the invention. Accordingly, the preferred embodiments described herein are deemed illustrative rather than limiting the true scope of the invention being set forth in the claims appended hereto.

What is claimed is:

1. A system for mounting photovoltaic (PV) panel modules to a support structure comprising:
    a first and second PV panel module each including mounting structures thereon;
    a first elongate member securable to the support structure and including a plurality of first mounting sites positionally fixed thereon in a predetermined location and spaced along a length of the first elongate member, the first mounting sites including an element for securing the first and second PV panel modules to the first elongate member;
    a second elongate member securable to the support structure and including a plurality of second mounting sites positionally fixed thereon in a predetermined location and spaced along a length of the second elongate member, the second elongate member being spaced from the first elongate member and aligned therewith in a generally parallel orientation, the second mounting sites including an element for securing the first and second PV panel modules to the second elongate member; and
    the position of the first and second elongate members being adjustable relative to each other to align the plurality of first and second mounting sites in a configuration to form a first and second set of fixed mounting sites, the first set of fixed mounting sites corresponding to the mounting structures on the first PV panel module, and the second set of fixed mounting sites corresponding to the mounting structures on the second PV panel module, wherein the first PV panel module is securable to the first and second elongate members upon cooperation of the first set of mounting sites and the first PV panel module mounting structures and the second PV panel module is securable to the first and second elongate members adjacent to the first PV panel module upon cooperation of the second set of mounting sites and the second PV panel module mounting structures, and wherein the plurality of first mounting sites and the plurality of second mounting sites are positionally fixed on the first and second elongate members respectively before the installation of the first and second PV panel modules thereon; and
    wherein one of the first and second elongate members includes a wireway extending along a length thereof, the wireway forms a conduit for accommodating therein wires operably connected to the first and second PV panel modules, the wireway including a plurality of connection stations spaced along a length thereof and having a fixed position relative to the wireway, the plurality of connection stations each having an electrical connector extending through a wall of the wireway and removably connected to one of the first and second PV panel modules, and the connector stations are disposed on the wireway wherein the connector stations align with a module junction box disposed on the underside of the first and second PV panel modules.

2. The system of claim 1, wherein aligning the first and second elongate members in a predetermined configuration aligns the mounting sites thereon, such that a plurality of PV panels are securable along the length of the first and second elongate members without adjusting the position of the first and second mounting sites.

3. The system of claim 1, wherein the mounting structures of the first PV panel module include a plurality of mounting holes formed in the PV panel and the mounting sites include upstanding posts engagable with the mounting holes.

4. A system for mounting photovoltaic (PV) panel modules to a support structure comprising:

a frameless PV panel module including include a plurality of mounting holes formed there through;

a first elongate member securable to the support structure and including a plurality of first mounting sites spaced along a length of the first elongate member, the first mounting sites being positionally fixed on the first elongate member in predetermined positions;

a second elongate member securable to the support structure and including a plurality of second mounting sites spaced along a length of the second elongate member, the second elongate member being spaced from the first elongate member and aligned therewith in a generally parallel orientation, the second mounting sites being positionally fixed on the second elongate member in predetermined positions; and the position of the first and second elongate members being adjustable relative to each other to align the first and second mounting sites in a configuration to form a first set of mounting sites, the first set mounting sites corresponding to the mounting holes in the PV panel, wherein the PV panel module is securable to the first and second elongate members upon cooperation of the first set of mounting sites and the mounting holes, and wherein the PV panel module includes a plurality of solar cells and the mounting holes are disposed on the PV panel module between the plurality of solar cells.

5. The system of claim 4, wherein the mounting sites include upstanding members insertable through the plurality of mounting holes.

6. The system of claim 4, wherein the one of the first and second elongate members includes thereon a wireway extending along a length thereof, the wireway forms a conduit for accommodating therein wires operably connected to the frameless PV panel module.

* * * * *